United States Patent [19]

Goldfarb

[11] Patent Number: 5,051,869
[45] Date of Patent: Sep. 24, 1991

[54] ADVANCED CO-FIRED MULTICHIP/HYBRID PACKAGE

[75] Inventor: Harold Goldfarb, Irvine, Calif.

[73] Assignee: Rockwell International Corporation, El Segundo, Calif.

[21] Appl. No.: 521,783

[22] Filed: May 10, 1990

[51] Int. Cl.⁵ .................. H05K 5/02; H05K 5/06; H05K 7/02
[52] U.S. Cl. .................. 361/399; 361/395
[58] Field of Search .............. 174/52.4; 361/396, 395, 361/399, 406, 410, 412, 413, 414

[56] References Cited

U.S. PATENT DOCUMENTS

| | | | |
|---|---|---|---|
| 3,916,434 | 10/1975 | Garboushin | 357/74 |
| 4,076,955 | 2/1978 | Gates, Jr. | 174/52.4 |
| 4,100,589 | 7/1978 | McGann | 361/399 |
| 4,105,861 | 8/1978 | Hascoe | 174/52.4 |
| 4,208,698 | 6/1980 | Narasimhan | 361/414 |
| 4,266,089 | 5/1981 | Scherer | 174/52.4 |
| 4,266,090 | 5/1981 | Scherer | 174/52.4 |
| 4,272,644 | 6/1981 | Visser et al. | 174/52.4 |
| 4,288,841 | 9/1981 | Gogal | 361/414 |
| 4,291,815 | 9/1981 | Gordon et al. | 174/52.4 X |
| 4,331,253 | 5/1982 | Gordon et al. | 174/52.4 X |
| 4,332,341 | 6/1982 | Minetti | 228/180.2 |
| 4,352,449 | 10/1982 | Hall et al. | 228/123 |
| 4,356,047 | 10/1982 | Gordon et al. | 156/89 |
| 4,372,037 | 2/1983 | Scapple et al. | 174/524 X |
| 4,423,468 | 12/1983 | Gatto et al. | 174/52.4 |
| 4,445,633 | 5/1984 | Bonham, Jr. | 228/102 |
| 4,471,259 | 9/1984 | Stoermer et al. | 310/353 |
| 4,477,828 | 10/1984 | Scherer | 357/80 |
| 4,491,622 | 1/1985 | Butt | 428/632 |
| 4,506,108 | 3/1985 | Kersch et al. | 174/52.4 |
| 4,547,624 | 10/1985 | Town et al. | 174/52.4 |
| 4,551,746 | 11/1985 | Gilbert et al. | 361/414 |
| 4,577,056 | 3/1986 | Butt | 174/52.4 |

FOREIGN PATENT DOCUMENTS 2108594 5/1987 Japan .................. 361/412

OTHER PUBLICATIONS

Chip Carrier Offers Microcircuit Gains—Aviation Week and Space Technology, Jan. 24, 1977.
Custom-Design Microcircuit Costs Cut—Aviation Week and Space Technology, Feb. 14, 1977.
Cures Sought for Parts Contamination—Aviation Week and Space Technology, Apr. 11, 1977.
Flip TAB, Copper Thick Films Create the Micropackage—Electronic/Nov. 3, 1982.
Batch-Made Packages Hold Dense ICs, Save Space, Survive Tough Environments—Electronics/Apr. 21, 1983.
Thermal Frontiers in the Design and Packaging of Microelectronic Equipment—Mechanical Engineering-/Jun. 1983.
Surface Mounting Alters the PC-Board Scene—Electronics/Feb. 9, 1984.
Inside Technology, Japan's Packaging Goes World Class Electronics/Nov. 11, 1985.

Primary Examiner—Leo P. Picard
Assistant Examiner—Michael W. Phillips
Attorney, Agent, or Firm—H. Fredrick Hamann; George A. Montanye; Tom Streeter

[57] ABSTRACT

An advanced co-fired multichip hybrid package comprises a castellated base, each castellation leading to a pad. An insulated wall rises from the leads, but not from the pads, and is topped by a kovar sealing ring and a layer of solder. A board of chips or other electronic components has a plurality of metallized vias extending therethrough, each via being in registration with a pad and having a ball of solder placed in it. A kovar lid is placed on the wall, and the entire apparatus is fired and cooled. The solder on the wall seals the lid to the wall, and the solder ball in each via bonds the board both mechanically and electrically to the base. No wire bond is needed.

6 Claims, 5 Drawing Sheets the insulating layer 20, with a sealing ring 24 on the top of the wall 22. The sealing ring 24 preferably comprises kovar, as does the lid 26 which rests on the sealing ring 24. The under side of the lid 26 includes a layer of solder

ADVANCED CO-FIRED MULTICHIP/HYBRID PACKAGE

BACKGROUND OF THE INVENTION

1. Technical Field

The present invention relates to packaging for integrated circuits (chips), and has particular relation to such packaging in which the chip substrate may be soldered into the package concurrently with the soldering of circuit to the feed throughs of the package.

2. Background Art

Chips and the substrates to which they are bonded are often subjected to harsh environments. It is therefore necessary to hermetically seal them in packages to protect them from such environments, yet simultaneously allow signals to enter and exit the package through various ports in the package.

A major problem in the prior art has been the necessity of connecting the chip/substrate to the ports of the package by fine wires. When the chip/substrate/package combination is subjected to acceleration, vibration, or other stress, these wires can work loose, rendering the combination inoperative.

It is an object of the present invention to eliminate the need for wire bonds.

It is a feature of the present invention that the substrate is soldered to the package.

It is an advantage of the present invention that such soldering of the substrate to package may take place concurrently with the soldering of the feed-throughs of the package, thereby minimizing the number of thermal cycles that the chip or chips and substrate are subjected to.

BRIEF DESCRIPTION OF THE DRAWINGS

These and other objectives, features, and advantages will become apparent with reference to the following drawings, in which.

DETAILED DESCRIPTION OF A PREFERRED EMBODIMENT

Figure 1:
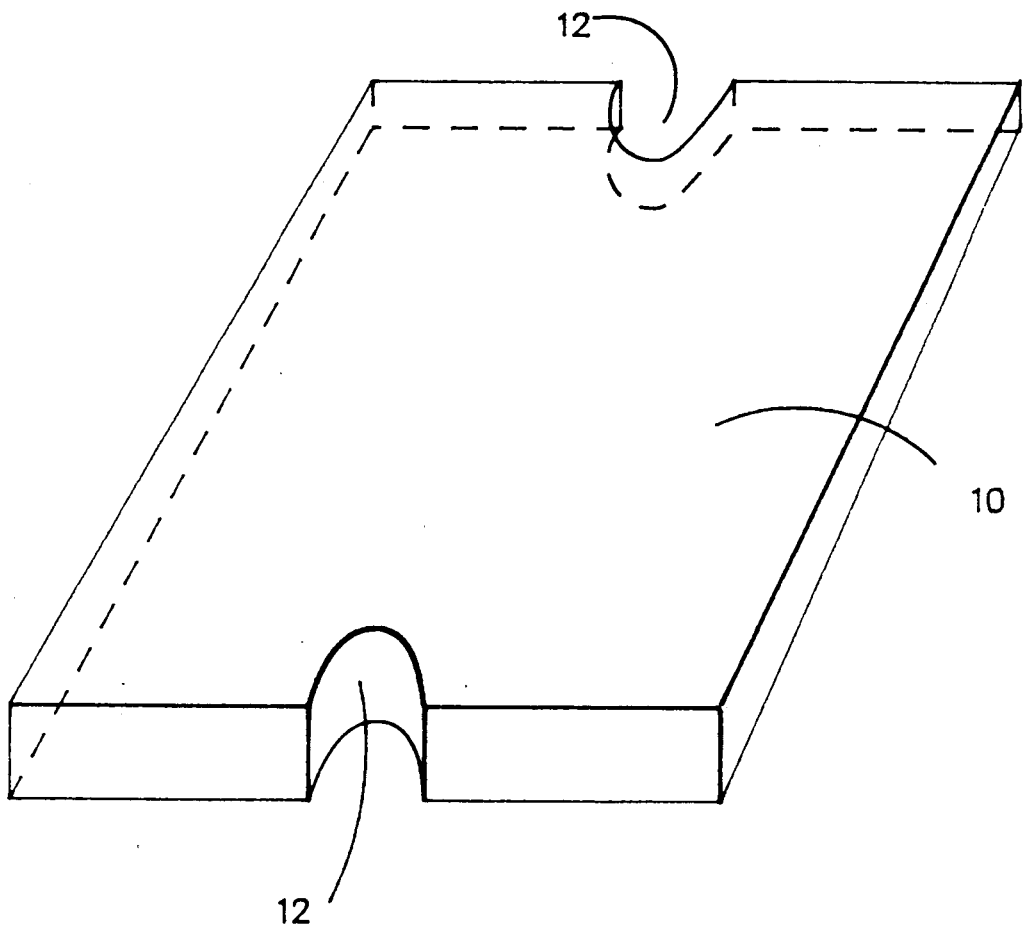
FIG. 1 shows a base.

Turning now to FIG. 1, a ceramic base 10 is shown, the perimeter of which includes a plurality of castellations 12.

Figure 2:
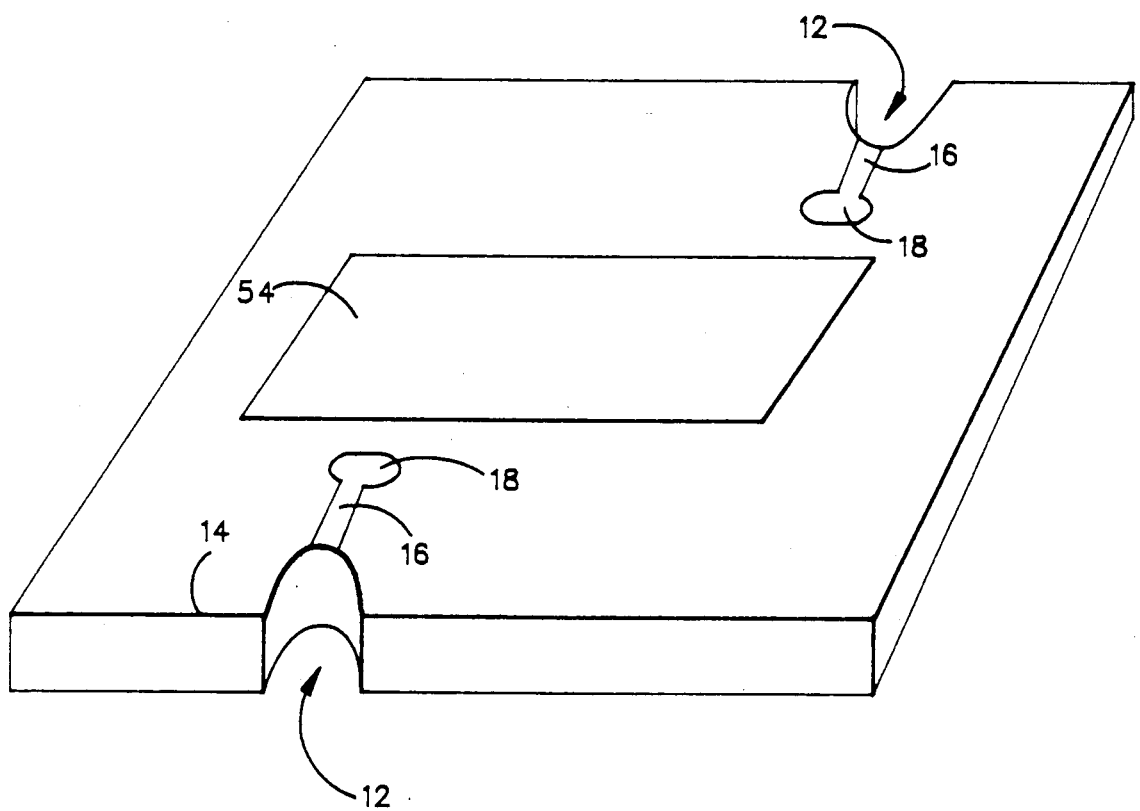
FIG. 2 shows a base with metallization.

In FIG. 2, the castellations 12 are metallized with a layer of metal 14, and a trace 16 leads from the layer 14 to a pad 18 well inward of the perimeter of the base 10. A metallized pad 54 is included for interconnection with a metallized pad on bottom of multi-layer board 28.

Figure 3:
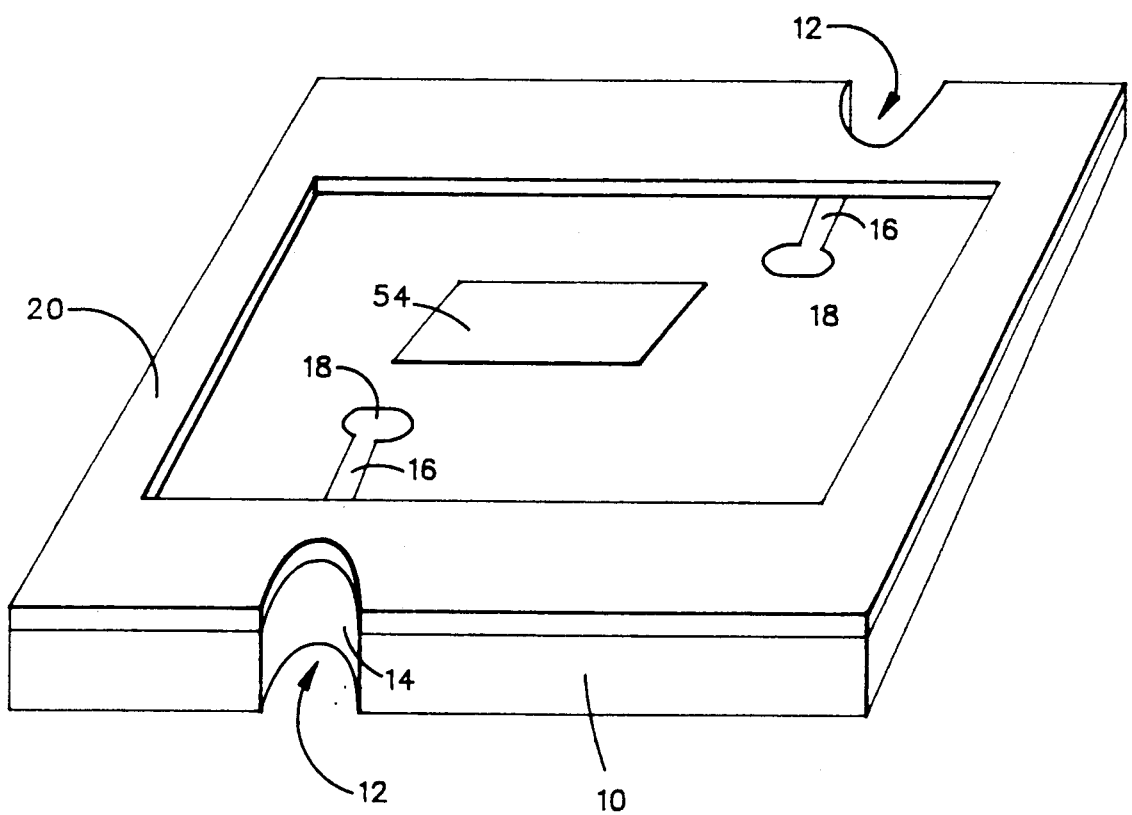
FIG. 3 shows a metallized base with a rectangular annular layer of insulation over the metallization.

FIG. 3 shows an insulating layer 20 laid down over the perimeter of the base 10, thereby insulating the layer 14 and a portion of the trace 16 from apparatus to be placed above it.

Figure 4:
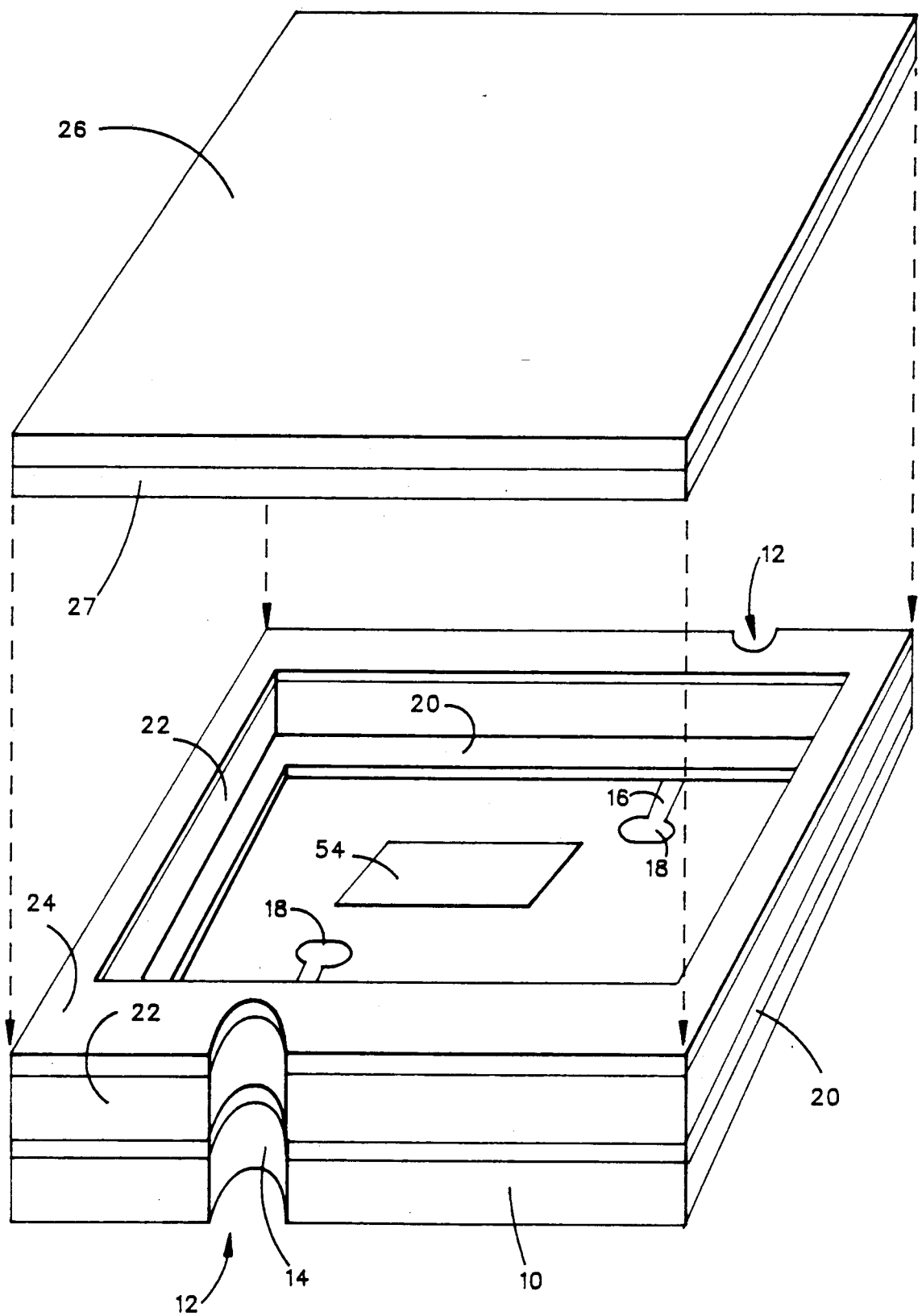
FIG. 4 shows an insulated metallized base with walls and lid, forming a package.

FIG. 4 shows a wall 22 built on the outside portion of 27, or, if desired, a separate ring of solder above the sealing ring 24 may be used. Kovar is selected because it has a coefficient of thermal expansion which closely approximates that of the wall 22 and base 10, which are comprised of ceramic.

Figure 5:
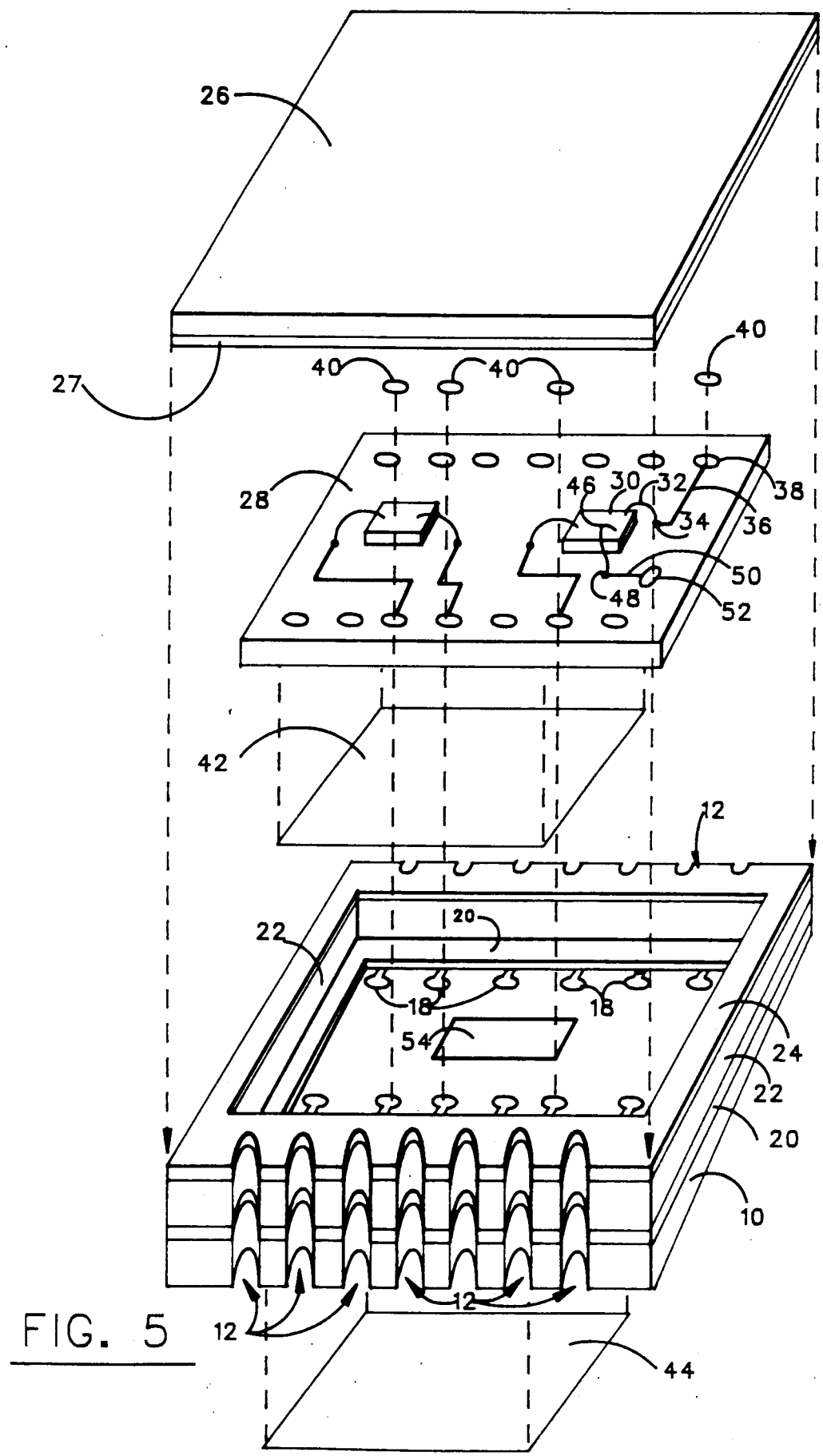
FIG. 5 shows a package with a multi-layer board and chip ready to be contained therein.

In FIG. 5, a multi-layer board 28 supports one or more integrated circuits (chips) 30. Other electronic components may be used instead of, or in addition to, the chip 30. The chips 30 are connected by wires 32 to pads 34, which are connected by traces 36 to large vias 38 on the perimeter of the multi-layer board 28; each large via 38 being aligned with a pad 18. The large vias 38 are metallized. A solder ball 40 is placed on the top end of each large via 38 of interest. When the multi-layer board 28 is placed on the base 10, heating of the entire structure will simultaneously bond the multi-layer board 28 to the base pad 54, and will melt the solder balls 40 so that the resultant molten solder will form both an electrical connection and a mechanical connection between each large via 38 and its corresponding pad 18. An additional sheet of solder 42 may be placed on the under side of the multi-layer board 28 so as to form an additional electromechanical bond between the multi-layer board 28 and the base 10. The solder sheet 42 also aids in thermal dissipation. A second sheet of solder 44 on the underside of the base 10 provides additional electrical, mechanical, and thermal connection between the base 10 and whatever it is resting on.

The chips 30 not only have wires 32 going to pads 34 and traces 36 to large vias 38, which are connected with the base 10; they also have wires 46 which are connected to pads 48 connected to traces 50 connected to small vias 52, which enter the multi-layer board, but do not penetrate through it to a pad 18. This latter structure between the chip 30 and small via 52 does not require a solder ball 40, since it is being bonded electrically with metal filled vias to complete the circuitry within the multi-layer structure.

The wires 32 and 46 may be omitted if a flip-chip structure is used, in which the chips 30 are bonded directly to the pads 34 and 48.

Finally, the Kovar lid 26 is seam welded to the Kovar sealing ring 24 to effect a hermetically sealed package or enclosure.

INDUSTRIAL APPLICABILITY

The present invention is capable of exploitation in industry, and can be used, in any situation in which it is desired to avoid the weaknesses of wire bonding, while subjecting the chip and substrate to the minimum number of thermal cycles. It can be made of components which are, if taken individually, entirely conventional, or it can be made from their nonconventional counterparts.

While a particular embodiment of the present invention has been described above, the present invention is not limited thereto, but is limited only by the following claims.

What is claimed is:

1. An article of manufacture, comprising, in combination:
   (a) a package, comprising:
      (1) a base having a perimeter and a plurality of electrically conductive castellations around the perimeter;

(2) a plurality of traces, each trace extending on an upper surface of the base to a pad on the upper surface of the base;

(3) a wall extending upward from the perimeter of the base over the traces, the base and the wall forming a cavity, the pads remaining exposed, and an upper surface of the wall being adapted to receive a lid; and (b) a board of electronic components, the board being containing within the cavity, the board having a plurality of vias extending therethrough, each via being in registration with a respective pad, and each via being electrically and mechanically connected to its respective pad by solder.

2. The package of claim 1, further comprising a layer of insulation between the traces and the wall.

3. The package of claim 1, wherein the upper surface of the wall comprises a sealing ring.

4. The package of claim 1, further comprising a layer of solder between the base and a portion of the board.

5. The package of claim 1, further comprising a layer of solder on an exterior surface of the base.

6. The package of claim 1, further comprising a layer or ring of solder lying between a lid and the upper surface of the wall.

* * * * *